US007329596B2

(12) United States Patent
Babich et al.

(10) Patent No.: US 7,329,596 B2
(45) Date of Patent: Feb. 12, 2008

(54) METHOD FOR TUNING EPITAXIAL GROWTH BY INTERFACIAL DOPING AND STRUCTURE INCLUDING SAME

(75) Inventors: Katherina E. Babich, Chappaqua, NY (US); Bruce B. Doris, Brewster, NY (US); David R. Medeiros, Ossining, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/259,654

(22) Filed: Oct. 26, 2005

(65) Prior Publication Data

US 2007/0090487 A1    Apr. 26, 2007

(51) Int. Cl.
*H01L 21/44* (2006.01)
(52) U.S. Cl. ............... 438/607; 438/514; 257/E21.09; 257/E21.092; 257/E21.12
(58) Field of Classification Search ............. 438/607, 438/481; 257/E21.09, E21.092, E21.12
See application file for complete search history.

(56) References Cited

U.S. PATENT DOCUMENTS 5,156,994 A * 10/1992 Moslehi ................. 438/647
5,882,974 A * 3/1999 Gardner et al. ........... 438/286
6,156,615 A * 12/2000 Kepler .................... 438/305

* cited by examiner

*Primary Examiner*—Fernando L. Toledo
*Assistant Examiner*—Jarrett J Stark
(74) *Attorney, Agent, or Firm*—Scully, Scott, Murphy & Presser, P.C.; Robert M. Trepp, Esq.

(57) ABSTRACT

A method that allows for uniform, simultaneous epitaxial growth of a semiconductor material on dissimilarly doped semiconductor surfaces (n-type and p-type) that does not impart substrate thinning via a novel surface preparation scheme, as well as a structure that results from the implementation of this scheme into the process integration flow for integrated circuitry are provided. The method of the present invention can by used for the selective or nonselective epitaxial growth of semiconductor material from the dissimilar surfaces. More specifically, the invention comprises a method for counterdoping of n-FET and/or p-FET regions of silicon circuitry during the halo and/or extension implantation process utilizing a technique by which the surface characteristics of the two regions are made similar with respect to their response to wet or dry surface preparation and which renders the two previously dissimilar surfaces amenable to simultaneous epitaxial growth of raised source/drain structures; but not otherwise affecting the electrical performance of the resulting device.

14 Claims, 3 Drawing Sheets

METHOD FOR TUNING EPITAXIAL GROWTH BY INTERFACIAL DOPING AND STRUCTURE INCLUDING SAME

FIELD OF THE INVENTION

The present invention relates to semiconductor device fabrication, and more particularly to a method that allows for simultaneous, uniform selective or non-selective epitaxial growth of a material from similar or dissimilar surfaces by controlling interfacial doping. The present invention also relates to the semiconductor structure that is obtained using the method of the present invention.

BACKGROUND OF THE INVENTION

Selective epitaxial growth is the critical unit process for the formation of semiconductor structures including raised source/drain (RSD) regions used to enable silicon integrated circuit technology, such as complementary metal oxide semiconductor (CMOS) structures on a bulk Si-containing semiconductor or a silicon-on-insulator (SOI) and bipolar devices. As with all selective epitaxial processes, the growth of the RSD is highly dependent on the nature of the surface from which it is grown and, in turn, the pre-epitaxy preparation of that surface. For example, in some bulk silicon and in some partially depleted SOI (PDSOI) and fully depleted SOI (FDSOI) CMOS integration schemes, it is highly desirable to implant the halo and extension implants prior to the growth of the RSD. This leads to dissimilar surfaces in the n-field effect transistor (n-FET) and p-field effect transistor (p-FET) regions. In particular, the p-FET and the n-FET regions have different surface characteristics, in terms of their response to various surface treatments and rate of subsequent epitaxial growth. That is, in these two regions the surface preparation and epitaxial growth are generally dependent on the dopant type in those regions.

In order to simultaneously grow selective epitaxial films in both n-FET and p-FET regions, a surface preparation technique, which comprises techniques such as wet etching, plasma treatment, thermal processing, vapor treatment and other surface modifications, is needed that effectively removes undesired surface films from the desired growth regions.

As the surface characteristics are rendered dissimilar by nature of the implants (including, but not limited to: halo implant and/or source/drain extension implant), one of two results is often afforded: either a less aggressive surface preparation is imparted that does not effectively remove undesired films from one region leading to inadequate simultaneous growth in one region; or, a more aggressive surface preparation is used which allows simultaneous growth, but results in excessive thinning of the underlying crystalline or polycrystalline surface from which the epitaxial film is grown.

In view of the drawbacks mentioned with prior art processing of RSD regions, there is a need for providing a method which allows for simultaneous, uniform selective or non-selective epitaxial. growth of a material from surfaces, e.g., regions, having similar or dissimilar surface characteristics, without imparting substrate thinning.

SUMMARY OF THE INVENTION

The present invention describes a method that allows for simultaneous, uniform selective or non-selective epitaxial growth of a material on similar or dissimilar surfaces that does not impart substrate thinning via a novel surface preparation scheme, as well as a structure that results from the implementation of this scheme into the process integration flow for integrated circuitry. The dissimilar surfaces are typically doped surfaces such as, but not limited to: the source/drain region and/or the gate region of a field effect transistor (FET). When dissimilar surfaces are present, the method of the present invention typically provides a way to modify one of the dissimilar surfaces via interfacial doping such that it has substantially the same growth rate of an epitaxial material and response to surface preparation as one of the other dissimilar surfaces that are not subjected to the interfacial doping. When similar surfaces are present, the method of the present invention typically provides a way to induce a difference in one surface region via interfacial doping such that epitaxial growth of a material in that surface region is prevented.

More specifically, the invention comprises a method for counterdoping via interfacial doping of n-FET and/or p-FET regions of semiconductor circuitry during the halo and/or extension implantation process utilizing a technique by which the surface characteristics of the two regions are made similar with respect to their response to wet or dry surface preparation and which renders the two previously dissimilar surfaces amenable to simultaneous epitaxial growth of RSD structures; but not otherwise affecting the electrical performance of the resulting device.

The counterdoping method involves implantation of one or more implant species using selected energy and dose conditions in the n-FET and/or p-FET region that effectively affords surface characteristics of the doped region similar to that of its counterpart such that any subsequent pre-epitaxy surface preparation can be universal in affording similar surfaces for uniform, simultaneous epitaxial growth, but still allows for appropriate device performance. The energy and dose of the dominant implant species may be adjusted to afford desired performance. The counterdoping conditions are chosen to render only the surface affected to make the dissimilar surfaces similar in their response to surface preparation and therefore are generally of low energy and low dose.

Additionally, counterdoping can be employed to selectively inhibit epitaxial growth on pre-determined regions by using the same concept.

In broad terms, the method of the present invention comprises:

providing a structure having at least two regions, wherein said at least two regions have either similar or dissimilar surface characteristics in terms of their response to surface treatments and rate of epitaxial growth; and introducing an interfacial dopant into at least one of said at least two regions to modify the surface characteristic within that region to be either the same or different from the other region not including said interfacial dopant, with the proviso that when the substrate has regions of similar surface characteristics, then the interfacial dopant provides a region that has a dissimilar surface characteristic than the other region, and when the substrate comprises dissimilar surface characteristics, then the interfacial dopant provides a region having the same surface characteristic as that of the other region.

Following the introduction of the interfacial dopant, the inventive method contemplates the use of various surface treatment steps and/or epitaxial growth of a material from the regions including at least said interfacial dopant. The interfacial dopant that is introduced may comprise a counterdopant species or a neutral species. The interfacial dopant may be introduced via ion implantation, plasma immersion or by first providing a material layer including said interfacial dopant on a surface of said structure and then annealing to cause outdiffusion of the interfacial dopant from the material layer into the structure.

The method of the present invention can be implemented into existing semiconductor technologies including, for example, during the CMOS processing of FETs and the subsequent formation of RSD regions.

In addition to the method described above, the present invention also relates to the semiconductor structure that is formed utilizing the same. In broad terms, the semiconductor structure of the present invention comprises at least one material region that is doped or undoped, wherein said at least one material region further includes an interfacial dopant region that changes the surface characteristic of said at least one material region in terms of its response to surface treatments and rate of epitaxial growth compared with another material region.

In some embodiments, the at least one material region may further include an epitaxial material layer located thereon, wherein said interfacial dopant region is located between said at least one material region and said epitaxial material region.

In one preferred embodiment of the present invention, the at least one material region may comprise the source/drain area and/or the gate region of at least one FET.

DETAILED DESCRIPTION OF THE INVENTION

Figure 1A:
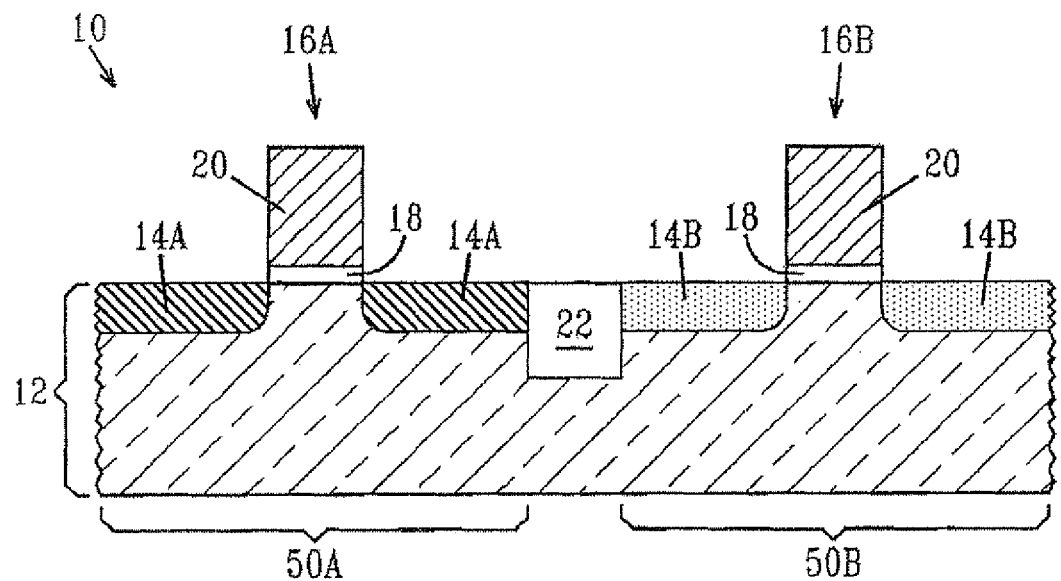
FIG. 1A-1D are pictorial representations (through cross sectional views) depicting the basic processing steps that are employed in one embodiment of the present invention.

The present invention, which provides a method of interfacial control for selective or non-selective epitaxial growth for semiconductor structures as well as the structures that result from such a method, will now be described in greater detail by referring to the drawings that accompany the present application. It is noted that the drawings of the present invention are provided for illustrative purposes and as such they are not drawn to scale. It is also noted that the following description and drawings describe the inventive method being implemented in fabricating a CMOS structure including RSD. Although such an embodiment is described and illustrated, the inventive method can be used for fabrication of other semiconductor devices, which include the epitaxial growth of a material layer from at least one material region that is doped or undoped.

FIG. 1A shows an initial structure 10 that can be used in the present invention. As shown, the initial structure 10 includes a semiconductor substrate 12 having patterned gate regions 16A and 16B located on a surface of the semiconductor substrate 12; each patterned gate region 16A and 16B includes a gate dielectric 18 and a gate conductor 20. The patterned gate regions 16A and 16B are located in at least two regions 50A and 50B that have dissimilar surface characteristics in terms of their response to surface treatments and rate of epitaxial growth. Specifically, the regions having dissimilar surface characteristics may include a doped region 14A and 14B that are of opposite conductivity type. The doped regions 14A and 14B are typically an extension implant region that are formed utilizing a conventional extension ion implantation that is well known in the art. The doped regions, which can also include halo implants, are part of the FET's source/drain region. The doped surface 14A may include n-type dopants or p-type dopants depending on the type of semiconductor structure that is being fabricated therein, while the doped surface 14B includes the opposite dopant type. As such, the patterned gate region 16A may comprise a p-type FET having p-type regions or an n-type FET having n-type regions. The patterned gate region 16B has the opposite conductivity as that of the patterned gate region 16B.

Each patterned gate region present in the initial structure may be formed utilizing conventional deposition, lithography and etching or a conventional gate replacement process can be used in forming the same. It is emphasized that the processing steps of forming the patterned gate regions are well known in the art and, as such, details concerning the fabrication of the patterned gate regions are not provided herein.

The semiconductor substrate 12 employed in the present invention comprises any semiconducting material including, but not limited to: Si, Ge, SiGe, SiC, SiGeC, Ga, GaAs, InAs, InP and all other III/V or II/VI compound semiconductors. The semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

At least one isolation region 22 is typically present within with the semiconductor substrate 12 to provide isolation between devices of different conductivity. The isolation region 22 may be a trench isolation region, a field oxide isolation region, or a junction isolation which are formed utilizing techniques well known in the art.

The gate dielectric 18 is comprised of an insulating material having a dielectric constant of about 4.0 or greater, preferably greater than 7.0. The dielectric constants mentioned herein are relative to a vacuum, unless otherwise stated. Note that $SiO_2$ typically has a dielectric constant that is about 4.0. Specifically, the gate dielectric 18 employed in the present invention includes, but is not limited to: an oxide, nitride, oxynitride and/or silicates including metal silicates, aluminates, titanates and nitrides. In one embodiment, it is preferred that the gate dielectric 18 is comprised of an oxide such as, for example, $SiO_2$, nitridized $SiO_2$, $SiO_xN_y$, $SiN_x$, $HfO_2$, $ZrO_2$, $Al_2O_3$, $TiO_2$, $La_2O_3$, $SrTiO_3$, $LaAlO_3$, $Y_2O_3$ and mixtures thereof.

The physical thickness of the gate dielectric 18 may vary, but typically, the gate dielectric has a thickness from about 0.5 to about 10 nm, with a thickness from about 0.5 to about 3 nm being more typical.

The gate conductor 20 may comprise single crystal or polysilicon, single crystal or poly crystalline SiGe, a silicide, a metal or a metal-silicon-nitride such as Ta—Si—N. Examples of metals that can be used as the gate conductor 20 include, but are not limited to: Al, W, Cu, Ti or other like conductive metals. The thickness, i.e., height, of the gate conductor 20 may vary depending on the technique used in forming the same. Typically, the gate conductor 20 has a vertical thickness from about 20 to about 180 nm, with a thickness from about 40 to about 150 nm being more typical.

It is noted that the description that follows assumes that the initial structure 10 of FIG. 1A is being employed. In some embodiments of the present invention, the gate conductor 20 in each of the regions of different conductivities may include a gate cap (not shown) such as, for example, $SiO_2$ or SiN. In yet another embodiment of the present invention, no gate cap is employed. The gate conductor 20 may be doped if desired to change the workfunction of the FET including the same utilizing a conventional ion implantation technique well known in the art.

Figure 1B:
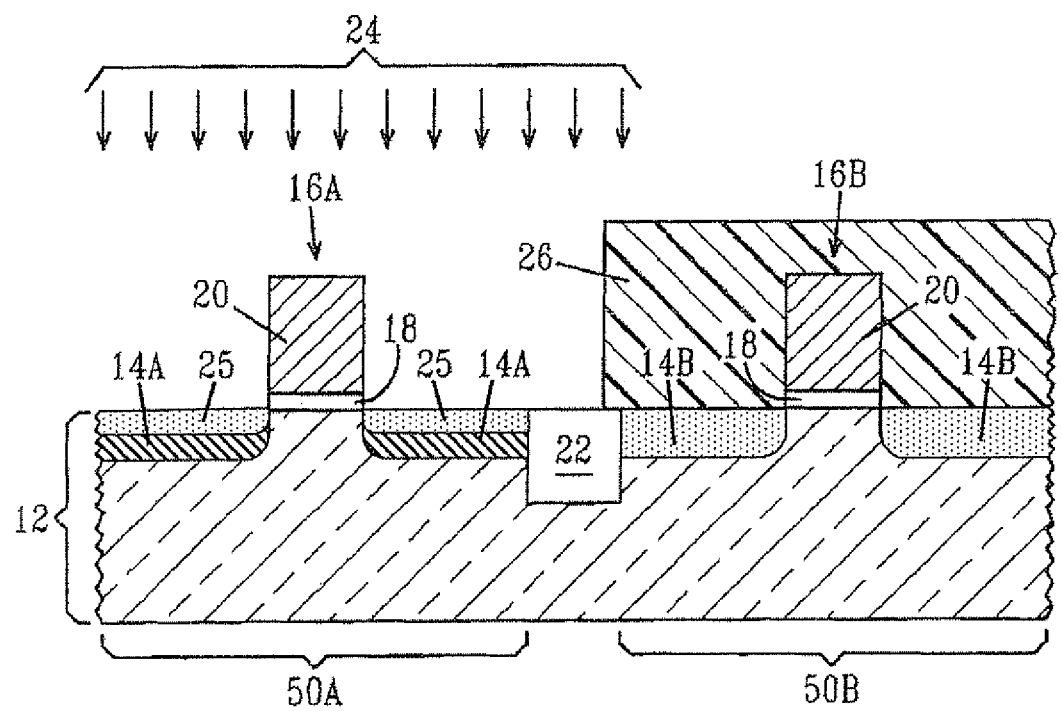

FIG. 1B shows the structure of FIG. 1A during the introduction of an interfacial dopant 24 into at least one of said at least two regions to modify the surface characteristic within that region to be the same as that of the other region not including the interfacial dopant. This step forms an interfacial doped region 25 within the material region that the interfacial dopant 24 is being introduced. Specifically, interfacial dopant region 25 is formed at or near the surface of the material region in which the interfacial dopant 24 is being introduced. By 'at of near the surface', it is meant that the interfacial dopant region 25 is present from about 0.5 nm or more from the surface of the material region that the interfacial dopant 24 is being introduced. In the specific illustration provided, the interfacial dopant 24 is introduced into the doped surface 14A formed in the region 50A including the patterned gate region 16A. As shown, a block mask 26 is formed over the region 50B including patterned gate region 16B and first doped surface 14B. The block mask 26 prevents the interfacial dopant 24 from being introduced into the area that includes the same. The block mask 26, which is formed by conventional deposition, lithography and optionally etching, may comprise a conventional photoresist material or a hard mask material such as SiN or $SiO_2$. It is noted that the block mask 26 is not required in all instances and, thus its formation is optional.

In the specific embodiment shown in FIG. 1B, the interfacial dopant 24 is being introduced by ion implantation or plasma immersion and it typically has the opposite conductivity than the surface that it is being introduced into. For example, when the doped surface is p-type, than the interfacial dopant is n-type. When the doped surface is n-type, the interfacial dopant is p-type. In some embodiments, a neutral species such as, for example, Ge, O, C and/or Si can be used as the interfacial dopant. When neutral species are used, block mask 26 is not typically needed and the neutral species may then be introduced into both first doped surfaces 14A and 14B making those two dissimilar surfaces have similar surface characteristics. This particular embodiment of the present invention is not shown, but would be understood by the illustration provided as well as the foregoing remarks.

When ion implantation is used to introduce the interfacial dopant 24 into the material region (in the embodiment shown the material region 50A is being doped), the interfacial dopant 24 ions are implanted using an energy of greater than 0.1 keV, with an energy from about 0.5 to about 5 keV being more typical. The dosage of the interfacial dopant 24 being introduced by ion implantation is typically greater than 1E10 atoms/$cm^2$, with a dosage from about 1E11 to about 5E14 atoms/$cm^2$ being more typical. Within the dosages provided above, the interfacial dopant region 25 typically has an interfacial dopant 24 concentration of greater than 1E17 atoms/$cm^3$, with a concentration from about 1E18 to about 5E19 atoms/$cm^3$ being more typical. It is noted that the interfacial dopant region 25 can be tuned utilizing other ion implantation conditions so long as the ion implantation conditions and hence the formation of the interfacial dopant region 25 does not compromise the performance of the resultant CMOS device. The ion implantation may occur at nominal room temperature (i.e., 20°-30° C.) or at a substrate temperature greater than 35° C. with a temperature from about 100° to about 300° C. being more typical.

When plasma immersion is used to introduce the interfacial dopant 24, the plasma immersion is performed by first providing a plasma that includes the interfacial dopant 24. The introduction of the interfacial dopant 24 is then performed utilizing plasma immersion conditions which are capable of forming the interfacial dopant region 25 at or near the surface of the material layer in which the interfacial dopant 24 is being introduced. Typically, the plasma immersion is performed utilizing standard operating conditions to achieve similar ion concentrations as stated above via conventional implantation.

Figure 1C:
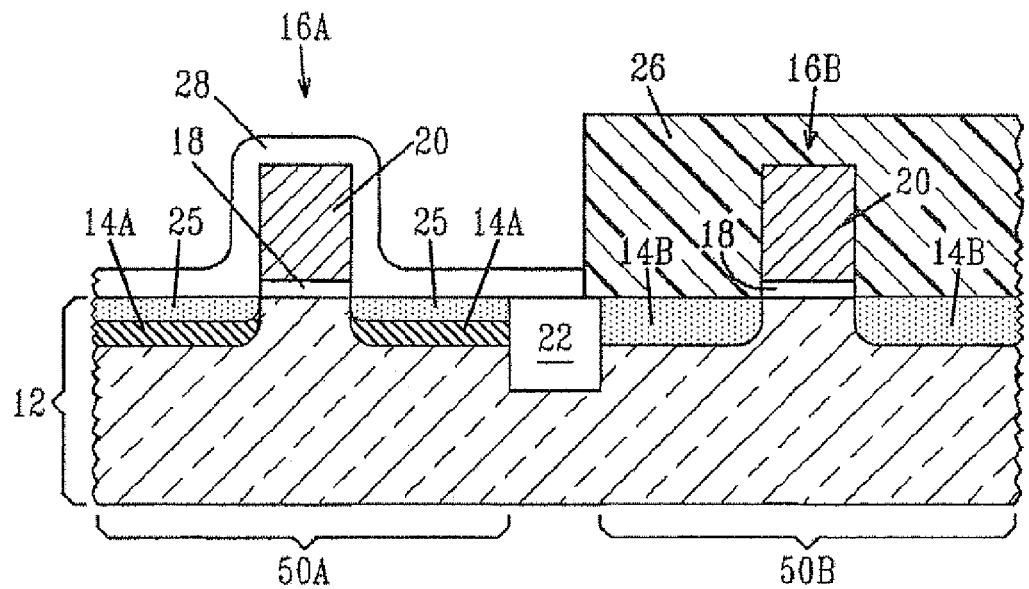

FIG. 1C shows another embodiment of the present invention for introducing the interfacial dopant 24 into one of the material regions of the structure that is doped or undoped. In this embodiment, a material layer 28 containing the interfacial dopant 24 is first deposited on the surface of the structure in which the interfacial dopant 24 is to be introduced. A block mask 26 can be formed over other regions of the structure in which the interfacial dopant 24 is not to be introduced. The material layer 28 including the interfacial dopant 24 is a sacrificial material such as a doped silicate glass. The material layer 28 can be deposited by any conventional deposition process such as, for example, chemical vapor deposition, plasma enhanced chemical vapor deposition, evaporation, spin-on coating, and physical vapor deposition. The thickness of the material layer 28 containing the interfacial dopant 24 may vary.

After depositing the material layer 28 containing the interfacial dopant 24 over the material region in which the interfacial dopant is to be introduced, the material layer 28 including the interfacial dopant 24 is then annealed under conditions that are effective for causing diffusion of the interfacial dopant 24 from the material layer 28 into the material region, e.g., first doped surface 14A, in which surface characteristic modification is required. The annealing may be performed in a furnace or in a chamber in which the material layer 28 was initially deposited. The anneal step is performed at a temperature from about greater than 550° C. with a temperature from about 900° to about 1100° C. being more typical. In addition to the specific types of annealing mentioned above, the present invention also contemplates rapid thermal annealing, spike annealing, laser annealing and other like annealing processes which are capable of performing the said outdiffusion. After diffusion, the material layer 28 is typically stripped from the surface of the structure utilizing a conventional stripping process.

It is noted that the interfacial dopant used in this embodiment changes the surface characteristic of the region receiving the interfacial dopant such that that modified region has a similar response to surface preparation and rate of epitaxial growth as the region that does not include the interfacial dopant. In embodiments when a neutral species is used as the interfacial dopant, the neutral species can be introduced into one or both of the regions including dissimilar surface characteristic to provide surfaces that have similar responses to surface preparation and rate of subsequent epitaxial growth.

Figure 1D:
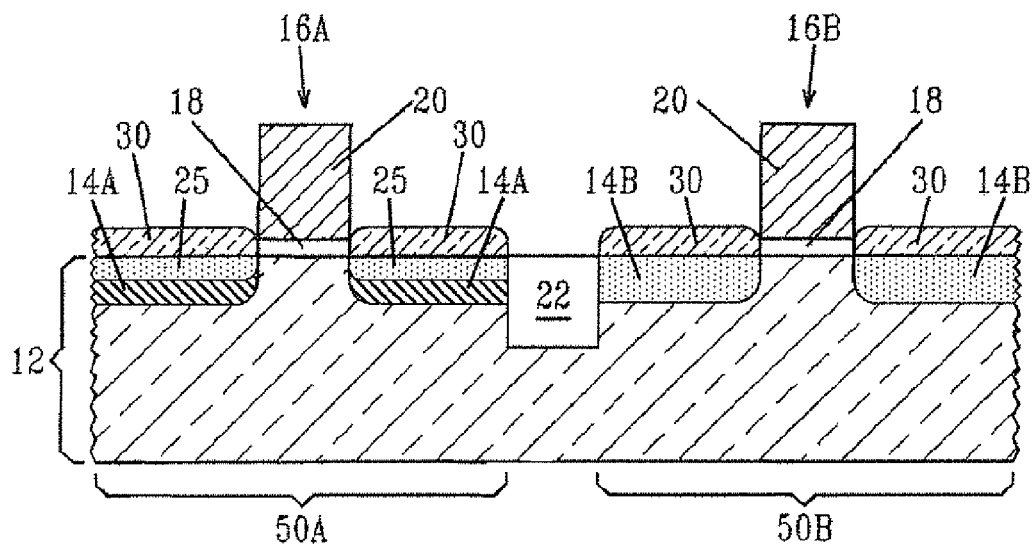

When the block mask 26 is used, the block mask 26 is stripped from the structure at this point of the present invention utilizing a conventional stripping. The structure is then subjected to a surface treatment process such as wet etching, plasma treatment, thermal processing, vapor treatment or other like surface treatment processes that removes undesirable films from the regions in which epitaxial growth will subsequently occur. Next, an epitaxial material 30 such as a semiconductor material including Si and SiGe, for example, is then grown on regions 50A and 50B utilizing a conventional epitaxial growth technique that is well known in the art. In some embodiments, the epitaxial growth may include isotopically pure precursors. FIG. 1D shows the structure after the epitaxial growth of material 30. It is noted that the first doped region 14A including the interfacial doped region 25 was modified so as to have the same response to the surface treatment and rate of epitaxial growth as than of first doped region 14B. Source/drain implantation and annealing may follow the epitaxial growth process.

It is noted that the method of the present invention eliminates the need for forming a sacrificial spacer on the sidewalls of the patterned gate region which sacrificial spacer is needed in the prior art during the epitaxial growth process.

In some embodiments, the interfacial dopant 24 may be introduced in the gate conductor 20 as well to provide that material region with the interfacial dopant region 25. During epitaxy, interfacial dopant region 25 within the gate conductor can be used to prevent growth of the epitaxy material atop the gate conductor 20 thus avoiding the need for a gate cap.

Figure 2A:
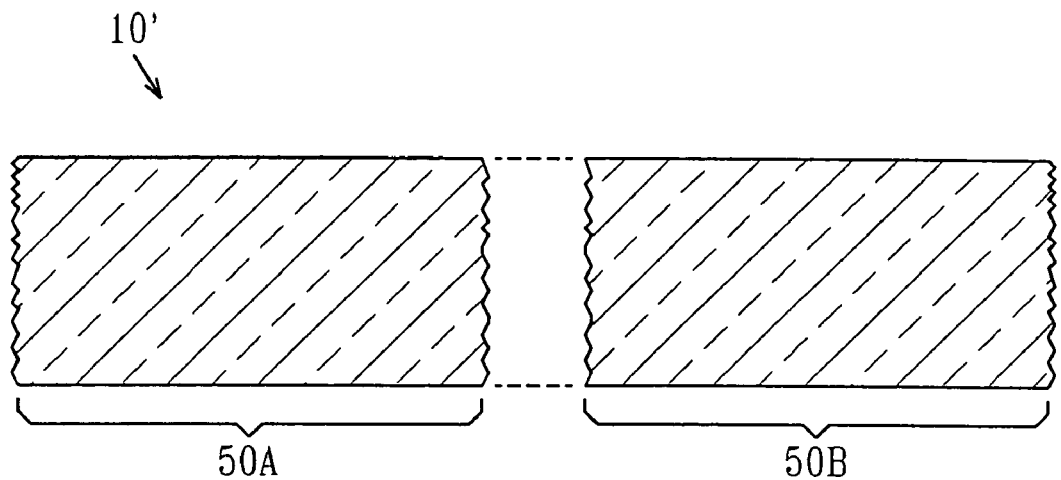
FIGS. 2A-2C are pictorial representations (through cross sectional views) depicting the basic processing steps that are employed in yet another embodiment of the present invention.
Figure 2B:
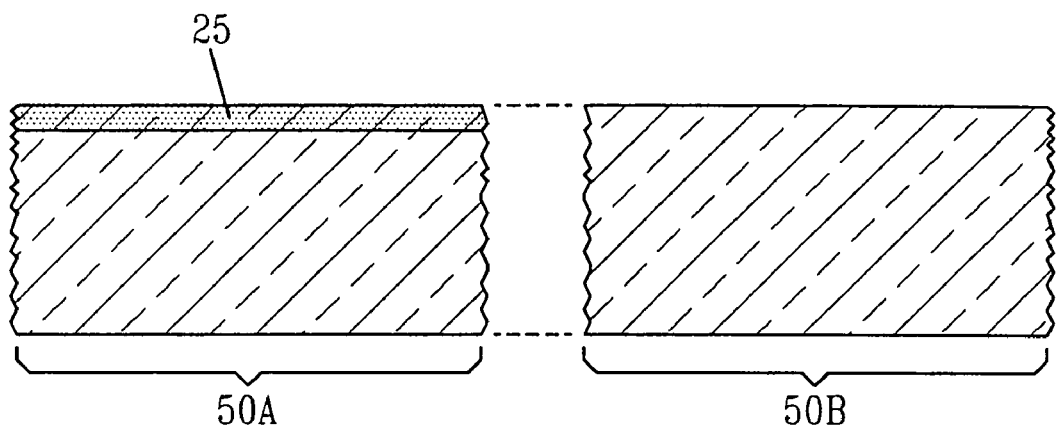
Figure 2C:
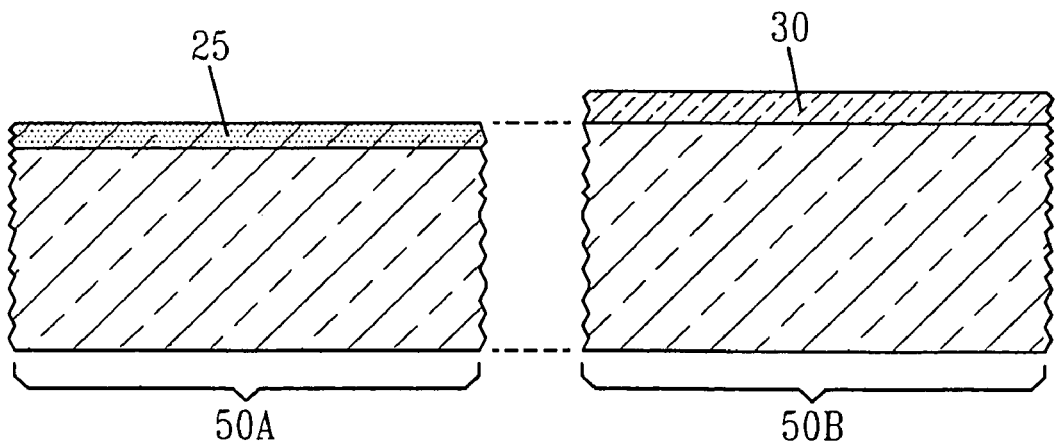

FIGS. 2A-2C are pictorial representations (through cross sectional views) depicting the basic processing steps that are employed in yet another embodiment of the present invention. In this embodiment, the interfacial dopant is introduced into surfaces of a structure that have similar surface characteristics, i.e., the same response to surface preparation and rate of epitaxial growth. The drawings provided in these figures are simplistic showing no device details. For example, FIG. 2A shows an initial structure 10' including material regions 50A and 50B (doped or undoped), both having the same surface characteristics, i.e., the same response to surface treatment and rate of epitaxial growth. FIG. 2B shows the structure after introducing the interfacial dopant into one of the regions forming the interfacial dopant region 25 within that region. Illustratively, the interfacial doped region 25 is introduced in first region 50A so as to modify that region such that its surface characteristic is different from that of region 50B. One of the above-mentioned techniques can be used in forming the interfacial doped region 25. FIG. 2C shows the structure after epitaxial growth. As shown, the epitaxial material 30 does not form in the region 50A including the interfacial doped region 25.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing a structure having at least two semiconductor regions, wherein said at least two semiconductor regions have dissimilar surface characteristics in terms of their response to surface treatments and rate of epitaxial growth; and
   introducing an interfacial dopant into at least one of said at least two semiconductor regions to modify the surface characteristics within that semiconductor region to be the same as the surface characteristics of the rest of said at least two semiconductor regions that does not include said interfacial dopant.

2. The method of claim 1 wherein one of said at least two semiconductor regions comprises a p-type dopant region.

3. The method of claim 2 wherein said interfacial dopant that is introduced into said at least one of said at least two semiconductor regions is n-type.

4. The method of claim 1 wherein one of said at least two semiconductor regions comprises an n-type dopant region.

5. The method of claim 4 wherein said interfacial dopant that is introduced into said at least one of said at least two semiconductor regions is p-type.

6. The method of claim 1 wherein said interfacial dopant is a counterdopant ion or a neutral species.

7. The method of claim 6 wherein said interfacial dopant is said neutral species selected from the group consisting of Ge, O, C and combinations thereof.

8. The method of claim 6 wherein said interfacial dopant is said neutral species and is introduced into both an n-dopant type region and a p-dopant type region.

9. The method of claim 1 wherein said interfacial dopant provides an interfacial dopant region at or near a surface of the semiconductor region in which said interfacial dopant is introduced such that epitaxial growth of a material over said semiconductor region including the interfacial dopant region is inhibited.

10. The method of claim 1 wherein said interfacial dopant provides an interfacial dopant region at or near a surface of the semiconductor region in which said interfacial dopant is introduced such that epitaxial growth of a material over said semiconductor region including the interfacial dopant region is promoted.

11. The method of claim 1 wherein said at least one of said at least two semiconductor regions includes a doped surface and is selected from the source/drain region, the gate region or both of a field effect transistor.

12. A method of fabricating a semiconductor structure comprising:
   providing a semiconductor substrate having a first doped surface of a first conductivity type and a second dopant surface of a second conductivity type, said first conductivity type differs from said second conductivity type;
   introducing an interfacial dopant into at least one of said doped surfaces to provide said surface including the interfacial dopant with same surface characteristics as that of the other doped surface not including said interfacial dopant; and
   epitaxial growing a semiconductor material from said doped surfaces, wherein an interfacial dopant region is present in said doped surface in which said interfacial dopant was introduced that separates said semiconductor material from said doped surface.

13. The method of claim 12 wherein said interfacial doped is a counterdopant ion or a neutral species.

14. The method of claim 12 wherein said introducing of said interfacial dopant is by ion implantation, plasma immersion or outdiffusion from a material layer including said interfacial dopant.

\* \* \* \* \*